United States Patent [19]
Schneider et al.

[11] Patent Number: 6,059,919
[45] Date of Patent: May 9, 2000

[54] FILM-STRIPPING PROCESS

[75] Inventors: Reinhard Schneider, Cadolzburg, Germany; David T. Baron, Worcestershire, United Kingdom

[73] Assignee: Atotech Deutschland GmbH, Germany

[21] Appl. No.: 09/011,253

[22] PCT Filed: Aug. 21, 1996

[86] PCT No.: PCT/EP96/03662

§ 371 Date: Jan. 28, 1998

§ 102(e) Date: Jan. 28, 1998

[87] PCT Pub. No.: WO97/08589

PCT Pub. Date: Mar. 6, 1997

[30] Foreign Application Priority Data

Aug. 23, 1995 [DE] Germany .......................... 195 30 989

[51] Int. Cl.[7] .................................................. B32B 35/00
[52] U.S. Cl. ..................... 156/344; 156/584; 118/411; 134/26; 134/34; 134/64 R
[58] Field of Search .................. 134/10, 26, 34, 134/64 R, 122 R; 118/411, 429; 156/344, 584

[56] References Cited

U.S. PATENT DOCUMENTS

| | | |
|---|---|---|
| 3,450,262 | 6/1969 | Hirs .......................................... 210/772 |
| 3,958,587 | 5/1976 | Brown .............................. 134/122 R X |
| 4,784,169 | 11/1988 | Striedieck .......................... 134/64 R X |
| 4,810,390 | 3/1989 | Flierl et al. .............................. 210/650 |
| 4,846,202 | 7/1989 | Kallweit .............................. 134/122 R |
| 4,938,257 | 7/1990 | Morris .................................. 134/172 X |
| 5,063,951 | 11/1991 | Bard et al. ............................. 134/64 R |
| 5,427,627 | 6/1995 | Canestaro et al. .................... 134/26 X |
| 5,632,847 | 5/1997 | Ohno et al. ............................... 156/344 |
| 5,762,257 | 6/1998 | Garrecht .............................. 118/429 X |
| 5,863,332 | 1/1999 | Foster et al. ............................ 118/314 |

FOREIGN PATENT DOCUMENTS

| | | |
|---|---|---|
| 0 254 550 | 7/1987 | European Pat. Off. . |
| 0 547 488 | 12/1992 | European Pat. Off. . |
| 24 33 653 | 1/1974 | Germany . |
| 30 02 732 | 8/1981 | Germany . |
| 30 11 061 | 10/1981 | Germany . |
| 32 01 880 | 8/1983 | Germany . |
| 3201880 | 8/1983 | Germany ................................ 134/26 |
| 84 01 675 | 11/1985 | Germany . |
| 35 28 575 | 2/1987 | Germany . |
| 39 16 694 | 11/1990 | Germany . |

*Primary Examiner*—Mark A. Osele
*Attorney, Agent, or Firm*—Paul & Paul

[57] ABSTRACT

There are described a method and a device for uniform chemical detachment of layers of resist in the form of easily-filtered particles from plate-shaped surfaces of a material for electroplating. The method is preferably used in horizontal continuous systems in printed circuit board technology. According to prior art, spraying and squirting processes are used for resist stripping. Disadvantageous among other things is the short service life of the bath due to the resist which cannot be entirely filtered out of the solution due to dissolution. According to the invention, the resist is detached from the surfaces of the printed circuit boards with only moderately flowing treatment liquids. In the first process stage a large quantity of treatment liquid is applied in a wave for swelling to the surfaces of the printed circuit boards by means of longitudinally-extended wave nozzles. in the second stage, for film detachment, wave nozzles having pressure in suction areas are preferably used. The post-treatment is carried out by flooding with reinforcement by intensive flows. The method operates without waste water with a multi-stage cascade rinsing, and with a long service life of the detachment agent. The resist detached from the surface is rapidly passed to a solid material filter by a short path and separated from the solvent before dissolving. The film is filtered out almost entirely and in an almost dry condition.

14 Claims, 1 Drawing Sheet

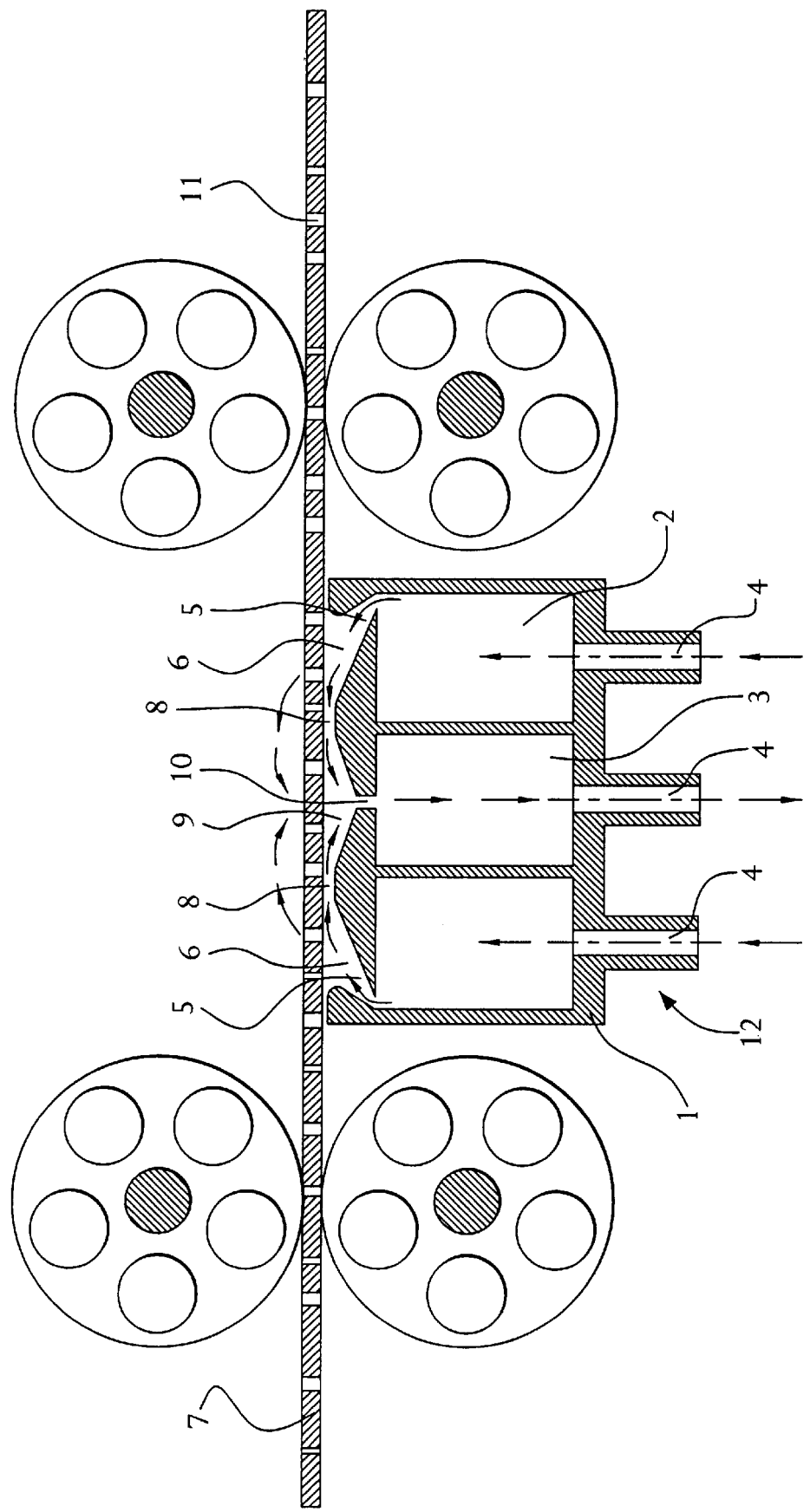

FILM-STRIPPING PROCESS

The invention relates to a method for uniform chemical detachment of layers of resists, particularly of photoresists, in the form of easily-filterable particles, from the surfaces of plate-shaped material for electrolysis, for example printed circuit boards and printed circuit films, by means of a solvent, and for removing the detached resist from the solvent.

In printed circuit technology resists serve to cover surfaces not to be treated. For this purpose for example photo-resists and screen-print paints are used.

In the manufacture of printed circuit boards, the following process steps among others are carried out:

Lamination of the plates metallised over the entire surface with copper and if necessary through hole plated, with a solid or liquid photo-resist, also called film. This as a rule involves a light-sensitive swellable polymer.

Exposure of the film through a mask which, depending on the printed circuit board process used, reproduces the conductor image positively or negatively.

Development of the film. The film is here removed from the unexposed points. The other points remain as hard and securely adhering layers on the surface of the material for treatment.

Electroplating of the surfaces not covered with film during build-up of the conductor pattern, i.e. with copper and then with tin or a tin/lead alloy as an etching resist.

Film stripping. At this point the resist film is dissolved from the surfaces with an aqueous solvent, and is thus totally removed.

Etching of the copper layers which were covered by the film.

Etching off of the etch resist layers made of tin or of tin/lead alloy.

Film stripping is preferably carried out chemically in horizontal continuous systems. Here the aqueous solution of the solvent is applied by spraying or squirting to the surfaces to be treated. A widely used agent for film stripping is caustic soda. There are also known for this purpose aqueous solutions which for example contain amino compounds or ionic nitrogen compounds as well as alkaline or earth-alkaline hydroxides and mixtures of these compounds. During stripping, the film is intended as far as possible only to be detached and not dissolved, as a film dissolved in the solution can no longer be filtered out. This would give rise to corresponding disposal problems and in particular to a short service life of the bath. Therefore the film for this purpose is firstly partially dissolved in a first process step and thereafter detached. The method step of pantial dissolution which is also named the swelling step, and the detachment procedure are carried out in a common bath with a plurality of spray and/or squirt registers.

The following disadvantages occur in known methods:

The concentration of solvent must be so selected that the solution partially dissolves the film in an acceptable time, yet does not too intensely dissolve it during the subsequent detachment. This contradiction may only be resolved by a compromise. In an excessively long treatment time, a portion of the film becomes dissolved, so that it can no longer be removed by filters. If the treatment time is too short, the film is not entirely removed from the surfaces.

For swelling, a long spraying time is required, as a large active quantity of liquid cannot be conveyed on to the surfaces by spraying or squirting. There is no intimate contact of the solution with the film to be swelled.

The film is detached from the surfaces of the printed circuit boards by intensive spraying at high pressure. In this process however the film is broken into small particles. These particles, due to their large surface, dissolve more quickly. Mechanically-acting filters for removing the detached film from the solution are ineffective for the dissolved proportion of the film. The service life of such a film stripping bath is therefore unsatisfactory.

In order to prevent the formation of foam during spraying and squirting, anti-foaming agents must be added to the aqueous solution. A number of disadvantages arise from the use of these agents:

the anti-foaming agent forms a viscous adhesive emulsion, which deposits on the walls of the working container and on the transport rollers.

the container is difficult to clean.

the adhesive emulsion is sporadically rolled by the transport rollers on to the surface of the material for treatment. Subsequent processes are influenced by this. Occasionally faults occur during stripping of the tin/lead alloy. The adhesive emulsion is in particular pressed in a securely adhesive manner between extremely fine conductor tracks. In order to remove the impurities, attempts are made to apply a spray at a higher pressure to the surfaces. This is moderately successful, but only with printed circuit boards. Printed circuit films are difficult to transport during a spray treatment. At a high spray pressure, for example at 10 bar, printed circuit films can no longer be transported, or so many guide members are necessary that the film surfaces are not sufficiently accessible.

anti-foaming agents are polymerisation agents which dissolve the plasticisers out of plastic materials of the containers and transport rollers. Therefore the systems must be constructed from stainless steel. Their manufacturing costs are roughly twice as high as corresponding systems made of plastics.

Due to the spraying and squirting, air is continually carried into the solutions. In this way undesirable chemical reactions occur:

by means of the air, oxygen and carbon dioxide is carried into the basic solvent. Caustic reacts therewith to form carbonate. For example, sodium carbonate is formed from caustic soda. This reaction is supported by the increased working temperature, which comes to about 60° C. to 65° C. The carbonate formed can however no longer be economically separated from the solvent. When there is an increased carbonate content, the effectiveness of the solvent is reduced. The stripping speed decreases as the carbonate content increases, so that the service life of the bath is reduced.

the oxygen carried into the film stripper solution during spraying reacts with the tin of the tin or tin/lead alloy layer to form tinstone ($SnO(OH)_x$). The tinstone causes the following problems:

at higher temperatures it is deposited on the stainless steel container walls required for these temperatures in such a securely adhering manner that it is practically no longer removable.

tinstone deposits on the copper surfaces from which the film has been removed. In the subsequent copper etching solution, the surfaces covered therewith cannot be etched off, or only incompletely.

the tinstone forms on the tin or lead/tin etch resist layers of the conductor tracks. Therefore a lengthy treatment of these fault points is necessary during the later removal of the etch resist. Apart from the fault points, this leads to an undesired removal from the copper conductor tracks.

Problems are additionally caused in the system by spraying:

When spraying, it is not possible with simple means to keep the solvent of the swelling agent separate from the solvent of the detachment area. This would have advantages for the service life of the swelling solution. The film, to be separated by mechanical means, occurs only in the detachment area, but rapidly dissolves in the swelling agent. Furthermore, operation could be with differing concentrations of the solvent, precisely adapted to the respective process stage. However, due to the spray registers, the solutions of both areas are mixed. This negative effect is reinforced when there are problems in the total removal of resist from points which are over-electroplated (mushroom-shaped overgrowths over the resist layers) or of securely adhering impurities, as described above. In this case operation must be with a higher spray pressure, for example of 10 bar or more. The consequence is an even greater inter-spraying and mixture of the swelling solution with the subsequent solution for detaching the resist layers. The separate circulatory guidance in known systems for separating both solutions is in this way largely negated. Thus detached film particles also pass into the swelling area. At this point they dissolve and thus also reduce the service life of this solution quite considerably. Differing concentrations of the solutions cannot be maintained.

Spraying endangers reliable transport of printed circuit films through the horizontal system. Among these films there may be counted in particular also the inner layers of multilayers. The inner layers form a meaningful proportion of the production, i.e. their production must be cost-effective and reliable, which is only possible to an insufficient degree with spray technology.

In all, the service life of the film stripper is insufficient. It comes to about a week to a month.

The method causes large quantities of waste water.

The publication DE 32 01 880 A1 discloses a method for removal of coatings from printed circuit boards without residues, in which the printed circuit board from which the coatings are to be removed is briefly contacted with an alkaline solution and, before initiation of the chemical dissolution process, is subjected to contacting with heated water. In this way the resist layers are intended to be only partially dissolved and then detached in more or less large particles or flakes. In order to carry out the method, the printed circuit boards to be treated are passed in a vertical position through a device, the treatment liquids being conveyed through slit nozzles disposed parallel to the transport path in the vicinity of the upper edges of the printed circuit boards, on to the surface of the printed circuit boards, and run from this point down the surfaces. By this means however the required treatment liquids cannot be applied uniformly to the surfaces of the printed circuit boards. In addition, the flooding of holes in the printed circuit boards is prevented, as the liquid sliding down a surface prevents penetration of the liquid from the other side and vice versa. Furthermore, the transport of films in such a system is impossible.

Finally it is proposed also to use brushes or stationary wiper blades to detach the resist layers, as clearly without these no reliable removal of resist is possible. These brushes rapidly fill with the adhesive resist; the detached resist remains adhering to the wiper blades. In this way their effectiveness is impaired. Moreover, the surfaces of the printed circuit boards can easily be damaged by this mechanical treatment.

The publication DE 30 11 061 A1 discloses a method for intensifying rinsing and cleaning processes for printed circuit boards, in which the printed circuit boards are guided through a rinsing agent wave section, the wave section, beneath the transport track for the printed circuit boards, consisting of at least one slit tube, from which the rinsing agent emerges.

According to another publication, DE 39 16 694 A1, such wave sections can also be used for cleaning and chemical treatment of printed circuit boards, a suction area being provided in addition in the arrangement disclosed therein on one side of the printed circuit boards and lying opposite the wave section.

However, neither of these publications contain any reference to the removal of coatings from printed circuit boards and the separation of the detached resist from the solvent used, or to the measures necessary for this.

The methods and devices disclosed rather have as their purpose to provide the most effective possible flow in the holes provided in the printed circuit boards, in order to ensure a good exchange of material. In the removal of coatings from printed circuit boards, this however does not play a significant part, as the resists are exclusively applied to the outer sides of the printed circuit boards and therefore also require to be removed from this area.

As the technology of fine circuitry advanced, the development of film stripping systems however has received increasing stimulus in the direction of high-pressure spraying.

Therefore the problem underlying the present invention is to avoid the disadvantages of prior art, and in particular to ensure a long service life of the treatment baths, as well as to enable separation, extensively without waste water, of the film detached in the form of easily-filtered particles, for cost-effective disposal. In addition, subsequent processes such as copper etching and tin/lead stripping should not be negatively effected by the uniform film stripping. Finally, short system lengths and process times are to be achieved by the method.

The problem is solved by claims 1 and 10. Advantageous embodiments of the invention are indicated in the subclaims.

It has become apparent that, contrary to the previous view, high-pressure spray systems could in particular overcome the problems in removal of coatings from fine printed circuit boards, calmed liquid flows, which are in intimate contact with the film to be removed on the printed circuit board, enabling considerably better results and further industrial advantages. However, it has also become apparent that it is not sufficient simply to flood the printed circuit boards. At this point the liquid exchange at the diffusion layer is far too small. Only the use of wave nozzles, which convey large quantities of liquid, brought about the desired result. By using these nozzles the disadvantages described in relation to spray nozzles and the consequences caused thereby are avoided. No anti-foaming agent is required, or only very little. The inclusion of air in the solutions is almost entirely eliminated. Due to the basically better effectiveness of the overall process, high working temperatures can be avoided. This permits the use of plastic containers made for example from polypropylene.

The method according to the invention operates without spray nozzles. It has been shown that the known spray and squirt processes are less effective than process steps with application of a calmed flow of liquid. By application of a flow of calmed liquid there should be understood a treatment with large moderately flowing quantities of liquid with a low excess pressure, in which the nozzles are disposed close to the material for treatment. Wave application from wave nozzles represents an example of this. By wave nozzles there should be understood such longitudinally-extended nozzles which convey a large quantity of treatment liquid at a low excess pressure as an uninterrupted wave against the surface of the material for treatment. The cross-section of the wave is large, in dependence on the width of the longitudinal slot of the nozzle in comparison to the spray nozzle. The wave profile thus generated is also called a standing wave. A longitudinally-extended wave nozzle, as described in the document DE 35 28 575 A1, proves effective for swelling and detachment of the film. It is suitable for conveying large quantities of liquid. Thus for example, with a nozzle length of 700 mm, about 7 $m^3$ of liquid per hour can be conveyed. A portion of the liquid passes through the holes in the printed circuit board to the opposite side. Thus the wave nozzle acts on both sides of the printed circuit board. In this way an intensive contact is produced between the liquid and the surface of the printed circuit board without liquid being sprayed into adjacent treatment baths.

The material for electroplating, preferably printed circuit boards and printed circuit films, is transported by suitable transport means in a horizontal position and in a horizontal direction in one transport plane through a plurality of treatment stations disposed one behind the other. Provided at least in the treatment stations in which the resist layers are swelled and detached, are at least one longitudinally extended wave nozzle disposed transversely to the transport direction and parallel and at a close spacing to the transport plane. By means of these wave nozzles, the treatment liquids are conveyed against the surface of the printed circuit boards as a wave.

The wave nozzles can be disposed to lie opposite one another or offset to one another. These nozzles preferably extend transversely to the transport direction of the printed circuit boards and across the entire working width of the continuous system. Catchment containers for the treatment liquid passing through the holes in the printed circuit boards can be located beneath upper wave nozzles on the opposite underside of the printed circuit board at a small spacing from the printed circuit board. This reinforces the two-sided effect also of the upper wave nozzles on the surfaces of the printed circuit boards.

It has proved particularly advantageous to provide the nozzles respectively with at least one pressure chamber and, disposed next to it, a suction chamber, each of which has at least one slot, and their slots opening towards the same side of the material for electroplating. In this way a more intense flow is achieved parallel to the surface of the printed circuit boards.

The resist layers are firstly swelled in a first treatment station by means of a swelling agent. In the subsequent treatment stage these layers are detached by means of a detaching agent in the form of easily-filtered particles. The aqueous solution of a solvent concentrate is used as a treatment liquid in all process stages of the method according to the invention. The metered addition of the solvent concentrate is carried out only into the first treatment station, in which the treatment liquid is used as a swelling agent. Therefore the concentrations differ from bath to bath. By means of an overflow and the carry-over of the material for treatment, the treatment liquid also passes into the second treatment station, in which there is located the detachment agent for the resist layers. The third process stage, which substantially represents a first rinsing with water, is subsequently fortified with detachment agent by the carry-over from the second treatment station. Return flows of the detachment agent can if necessary be passed entirely or partly into all three process stages. Thus an individual solvent concentration may be adjusted and maintained in all process stages. By means of suitable liquid guidance of the treatment liquids, mixture of the two agents is extensively avoided. Uncontrolled spraying of the liquid from one bath to the other therefore does not occur. The solutions are reliably and almost entirely separated by the known rollers, for example squeezing rollers and weirs in the operating areas of the horizontal system, and by separate catchment and supply containers and by separate circulatory guidance systems. There only remains the carry-over. By means of this separation, substantially only the bath for film detachment is charged with the detached polymer, which contributes to increasing the service life of the three-stage overall process.

The individual treatment stages will be described in the following:

First Process Stage, Swelling:

The swelling process is carried out with a swelling agent which has the highest concentration of the solvent. The solvent is in intensive contact with the surface of the printed circuit boards via the wave already described. At this point, large quantities of the solution are repeatedly and rapidly replaced by fresh solution on the surface. The film, starting from the surface, is swelled and partially dissolved, yet not entirely dissolved. The concentration and the action time are coordinated to this. Due to the rapid swelling, internal tensions arise in the at first hard film due to increase in volume, and which have a supportive effect during the subsequent detachment of the film from the surface.

Rollers transverse to the transport direction on the upper and undersides of the printed circuit boards between the swelling process and the detachment process at least partly break the film, which is under internal tension, from its foundation.

Second Process Stage, Detachment:

The concentration of the solvent concentrate in the detaching agent is so adjusted that with a given action time, dissolution of the film is to a large extent suppressed. The detachment and if necessary suction removal of the film with the detachment agent enriched with the resist is carried out predominantly over the entire surface by means of a pressure or a pressure/suction wave nozzle. In this case the film is not broken into small splinters. Generally, one wave nozzle located offset per side of the printed circuit boards is sufficient. As a consequence, short system lengths are made possible. The detachment over the entire surface and the adjusted chemical concentration prevents rapid dissolution of the detached film in the aqueous solution. Dissolution would be equivalent to a high chemical consumption, i.e. a short service life.

From the second treatment station, the charged detachment agent passes into a separator. This can for example consist of an obliquely-positioned screen. By means of the separator, the film is separated from the solvent. The detachment agent from which film has been removed is passed again into the system. In order to avoid dissolution of the resist in the detachment agent, the detachment agent is pumped as quickly as possible by the selection of short conveyance paths and high flow speeds into the separator.

The resist may be separated also from the solution in two stages. An additional fine filter in the filter return or an independent filter circuit, ensures removal of the finest film particles. This almost complete removal of the film from the treatment solution means that the service life of the overall process becomes extremely long. Test results indicate a service life of up to one year. The film separated in the filters, for reasons of costeffective disposal, is intended to be recovered as dry as possible and free of chemicals on the surface. This is brought about by a continual or periodic flushing of the separated film from a catchment chamber of the separator into a subsequent filter. The periodic flushing of the filter for example takes place every 5–60 minutes. The water used for flushing can be removed from the rinse cascade, and be passed back to that point. In particular, when the filter for separating the rinse water from the film is a centrifuge, the resultant film is almost dry.

Third Process Stage, Post-Treatment:

The post-treatment process, which is not always necessary, is carried out with a weak concentration of the solvent concentrate or only with enriched rinse water. This process serves as a safety stage for removing film residues which have not been taken up in the detachment process. Basically, wave nozzles may also be used here. However, flooding has proved more effective. The liquid is applied as a flow to both sides of the printed circuit board in a flood chamber in an intensive manner and in order to avoid an inclusion of air beneath the bath level. By means of this mechanical reinforcement, any possible film residues are removed from the surfaces. The weak concentration permits a longer treatment time without the risk of dissolution of the film residues.

The nozzles for generating the mechanical detachment by application of flow to the printed circuit boards, are supplied in a circuit with the treatment liquid. Nozzles which generate cavitation bubbles in conjunction with an intensive flow in a hydrodynamic manner beneath the bath level have proved extremely effective. Upon implosion of these bubbles on the surfaces of the printed circuit boards there arise traction and pressure forces which reinforce the removal of film residues. Such a nozzle is described in the German Disclosure Document 24 33 653. By means of the application of a uniform flow on both sides of the material for treatment beneath the bath level it is also possible to transport printed circuit films in a more reliable manner. The post-treatment process corresponds to a rinse, or chemical rinse. If necessary the solution from the third treatment station may be filtered through a fine separator. This chemical rinse is followed by further rinses. These are more appropriately in the form of cascades. The number of rinse cascades is so selected that the quantity of rinse water continuously added to the rinse cascades corresponds to the losses of treatment liquids in the treatment stations by evaporation and by carry-over during transport of the material for electroplating from one treatment station to the next and to the rinse cascades, minus the quantity of process chemicals metered in. The post-treatment stage is followed by a drying station.

The three process stages described have the following features:

1. Process stage, swelling:
    Intense exchange of material at the surfaces by intense wave application. Little mechanical reinforcement necessary.
2. Process stage, detachment:
    Small exchange of material at the surfaces through wave nozzles, more intense mechanical reinforcement by wave nozzles with pressure and suction effect.
3. Process stage, post-treatment:
    Small exchange of material at the surfaces or no exchange of material by flooding. Intense mechanical reinforcement by intensive application of flow and by cavitation.

The entire film stripping process can be operated in a five-fold rinse cascade without waste water. The last rinse cascade in the transport direction of the material for treatment is fed with fresh water. The added quantity covers the evaporation losses inclusive of the liquid evaporated in the drier, and the carry-over with the detached film. The treatment liquid is continuously supplemented with chemicals. The chemicals are metered into the first process stage. From this point the chemicals pass into the following process stages with correspondingly lower concentrations. By means of controlling the liquid overflows and by operating filter circuits, a balance of the concentrations in the individual process stages is achieved. This leads to long service lives of the overall process and to extensive elimination of waste water. With suitable filters, the detached but not yet dissolved film can be almost completely separated from the detaching agent, and recovered for disposal in an almost dry state. This also contributes to reduction of the costs of the overall process.

FIG. 1 serves for further explanation of the invention by illustrating the device.

The multiple-part wave nozzle body 1, preferably consisting of plastics, is shown in cross-section in FIG. 1. It consists of two pressure chambers 2 and a suction chamber 3. The chambers have pipe junctions 4 for connection to a pressure pump and to a suction pump. The pumps convey out of or into a common catchment container. In order to provide uniform liquid distribution in the chambers of the wave nozzle, a plurality of pipe junctions 4 can be attached along the nozzle body. The pressure chambers 2 can be interconnected by pipes. The treatment liquid flowing into the chambers 2 passes through the obliquely-positioned longitudinal slots 5 as a wave. The arrows indicate this. An excess pressure of liquid arises in each of the preceding apertures 6, when material for treatment 7 is at a small spacing in front of the pressure/suction wave nozzle 12. The nozzle 12 has surfaces 6, 8 provided with the slots 5, 10, and which are in the form of planes 6, 8 extending conically on both sides of the slots, in such a way that apertures 6, 9 result between the slots and the transport plane in which the material for electroplating is transported. The liquid flows through the aperture 8, which forms a channel with the material for treatment, into the aperture 9 of the suction area. A further longitudinal slot 10 permits passage into the suction chamber 3. The low pressure in the aperture 9 is opposed to the excess pressure in the apertures 6. The excess pressure also conveys treatment liquid through the holes 11 in the printed circuit board to the side lying opposite the nozzle. The suction portion of the wave nozzle 12 recovers this liquid back through the holes. A small proportion of the liquid is lost from this circuit. It passes without pressure back into a common catchment container. The pressure and suction effects of this nozzle compensate one another in such a way that, together with the liquid cushion between the printed circuit board and the nozzle, even films can be safely treated. For simplification, the nozzle body 1 may also be constructed with only one pressure chamber 2. In this case the central chamber 3 is eliminated, so that again a symmetrical pressure/suction wave nozzle results with preferably obliquely-positioned longitudinal slots 5. One of the original pressure chambers becomes the suction chamber.

What is claimed is:

1. Method for uniform chemical detachment of layers of resist, particularly of photoresists, in the form of easily-filtered particles from the surfaces of plate-shaped material for electroplating, by means of a detachment agent, and for removal of the detached resist from the detachment agent, said method comprising the steps of:

- transport of the material for electroplating in a horizontal position and horizontal direction through a treatment system,
- bringing the upper side and the underside of the material for electroplating into contact with treatment liquids by means of longitudinally-extended nozzles aligned substantially perpendicularly to the transport direction and parallel to the surfaces of the material for electroplating, in such a way that the treatment liquids for mechanical detachment of the resists are conveyed as an uninterrupted liquid wave against the surfaces of the material for electroplating, whereby the inclusion of air in the solutions is substantially eliminated,
- swelling of the resist layers by means of a swelling agent as a treatment liquid in a first treatment stage,
- thereafter detachment of the resist with the detachment agent as a treatment agent in a second treatment stage,
- avoiding mixture of said swelling agent and said detachment agent,
- guidance of the swelling agent and of the detaching agent in a filter circuit, admixture of the two agents being extensively avoided by appropriate liquid guidance and
- separation of the detached resist from the detachment agent by means of a separator suitable for this purpose.

2. Method according to claim 1, characterised in that the surfaces of the material for electroplating are subjected to post-treatment by total immersion in water or in a mixture of a solvent with water as a post-treatment agent in a third treatment stage after detachment of the resist.

3. Method according to claim 2, characterized in that the post-treatment agent is conveyed against the surfaces of the material for electroplating.

4. Method according to claim 2, characterized in that cavitation bubbles are hydrodynamically formed within the post-treatment agent conveyed against the surfaces of the material for electroplating.

5. Method according to one of claims 2, and 4, characterized in that, in order to avoid mixture of the swelling agent and of the detachment agent and further treatment liquids, rollers and weirs are formed, as well as separate treatment liquid circuits.

6. Method according to one of claims 2, and 4, characterized in that the nozzles for detaching the resist layers each have at least on pressure and one suction area, the treatment liquid being conveyed in succession through said areas.

7. Method according to one of claims 2, and 4, characterized in that the treatment liquid containing detached resist passes as quickly as possible by the selection of short conveyance paths and high flow speeds into the separator.

8. Method according to one of claims 2, and 4, characterized in that the detachment agent is additionally passed through a fine filter as a separator in order to remove fine resist residues.

9. Method according to one of claims 2, and 4, characterized in that the resist separated from the detachment agent by the separator is continuously or periodically flushed out of the separator with rinse water, and passed to a filter for separation of the rinse water, so that the resist is available after separation in an almost dry state and free of adhering process chemicals.

10. Device for uniform chemical detachment of layers of resists, particularly of photoresists, in the form of easily-filtered particles, from the surfaces of plate-shaped material for electroplating, by means of a detachment agent, and for removal of the detached resist from the detachment agent, said device comprising

- a plurality of treatment stations disposed one behind the other, in which the material for electroplating can be transported by suitable transport means in a horizontal position and horizontal direction in one transport plane, said plurality of treatment stations including at least a first treatment station for swelling the layers of resists by means of a swelling agent, and a second treatment station for detaching the layers of resists by means of a detaching agent,
- each of said treatment stations having at least one longitudinally extended wave nozzle disposed transversely to the transport direction and parallel to and in a close spacing to the transport plane, in which the resist layers are swollen and detached, for mechanical detachment of he resists by flow,
- appropriate connections and conveyance means for transporting the treatment liquids and the rinse water, and a separator for separating the detached resin from the detachment agent.

11. Device according to claim 10, wherein the nozzles have surfaces provided with the slots which are in the form of planes extending conically on both sides of the slots, in such a way that apertures (6,9) are located between the slots and the transport plane.

12. Device according to one of claims 10 and 11, wherein said nozzle includes obliquely-positioned longitudinal slots of the pressure chambers, which are aligned towards the suction chamber.

13. Device according to one of claims 10 to 11, wherein said nozzle includes two pressure chambers and suction chamber disposed between the pressure chambers.

14. A device according to claim 10, wherein:

- said nozzle within said first treatment station includes at least one pressure chamber, and
- said nozzle within said second treatment station includes at least one pressure chamber and at least one suction chamber.

* * * * *

UNITED STATES PATENT AND TRADEMARK OFFICE
CERTIFICATE OF CORRECTION

PATENT NO. : 6,059,919
DATED : May 9, 2000
INVENTOR(S) : Reinhard Schneider, David Baron It is certified that error appears in the above-identified patent and that said Letters Patent are hereby corrected as shown below: On the Title Page The Title, "Film-Stripping Process" should be--Method for Film Stripping--;
Col. 8, line 26-27, delete "by illustrating the device."

Signed and Sealed this

Seventeenth Day of April, 2001

*Attest:*

NICHOLAS P. GODICI

*Attesting Officer*     Acting Director of the United States Patent and Trademark Office